(12) United States Patent
Tang (10) Patent No.: US 12,176,884 B2
(45) Date of Patent: Dec. 24, 2024

(54) SURFACE ACOUSTIC WAVE RESONATOR, FILTER, MANUFACTURING METHOD THEREOF, AND COMMUNICATION DEVICE

(71) Applicant: Newsonic Technologies, Guangdong (CN)

(72) Inventor: Gongbin Tang, Guangdong (CN)

(73) Assignee: Newsonic Technologies, Shenzhen (CN)

( * ) Notice: Subject to any disclaimer, the term of this patent is extended or adjusted under 35 U.S.C. 154(b) by 399 days.

(21) Appl. No.: 17/675,286

(22) Filed: Feb. 18, 2022

(65) Prior Publication Data

US 2022/0173718 A1     Jun. 2, 2022

(51) Int. Cl.
  *H03H 9/25* (2006.01)
  *H03H 3/08* (2006.01)
  *H03H 9/64* (2006.01)

(52) U.S. Cl.
  CPC ............... *H03H 9/25* (2013.01); *H03H 3/08* (2013.01); *H03H 9/64* (2013.01); *H03H 9/6483* (2013.01)

(58) Field of Classification Search
  CPC ...... H03H 9/145; H03H 9/25; H03H 9/14511; H03H 9/009; H03H 9/00; H03H 9/64; H03H 3/08; H03H 9/6483
  (Continued)

(56) References Cited

U.S. PATENT DOCUMENTS

| | | | | |
|---|---|---|---|---|
| 2011/0063051 A1* | 3/2011 | Fedan | .................. | H03H 9/6406 333/195 |
| 2012/0105298 A1* | 5/2012 | Inoue | ................. | H03H 9/02992 333/133 |

(Continued)

FOREIGN PATENT DOCUMENTS

| | | |
|---|---|---|
| CN | 1498455 A | 5/2004 |
| CN | 101939911 A | 1/2011 |

(Continued)

OTHER PUBLICATIONS

"Higher angle of surface acoustic wave filter and GHz band Research on application to duplexer for mobile phones", Peripheral Systems Research Institute, Fujitsu Laboratories Co., Ltd., Media Device Research Department, Mar. 2008. 152 pages. Uploaded in 7 Parts.

(Continued)

*Primary Examiner* — Rakesh B Patel

(74) *Attorney, Agent, or Firm* — Leason Ellis LLP (57) ABSTRACT

A surface acoustic wave resonator, a filter, a manufacturing method thereof and a communication device. The surface acoustic wave resonator includes a piezoelectric material layer, an interdigital transducer and a dielectric layer; the interdigital transducer is located at a side of the piezoelectric material layer, and the dielectric layer is located between the interdigital transducer and the piezoelectric material layer. Therefore, the surface acoustic wave resonator can reduce the electromechanical coupling coefficient of the surface acoustic wave resonator by arranging the dielectric layer between the interdigital transducer and the piezoelectric material layer. In addition, the surface acoustic wave resonator can adjust the electromechanical coupling coefficient of the surface acoustic wave resonator by controlling the thickness of the dielectric layer.

18 Claims, 4 Drawing Sheets

(58) Field of Classification Search
USPC .......................................... 333/186, 193–195
See application file for complete search history.

(56) References Cited

U.S. PATENT DOCUMENTS

2016/0380614 A1* 12/2016 Abbott ............... H03H 9/14582
   333/195
2021/0384885 A1* 12/2021 Daimon ............. H03H 9/02834

FOREIGN PATENT DOCUMENTS

| CN | 204615783 U | 9/2015 |
| CN | 109983696 A | 7/2019 |
| JP | H1197973 A | 4/1999 |

OTHER PUBLICATIONS

Shogo Inoue et al., "Ultra-Steep Cut-Off Double Mode SAW Filter and Its Application to a PCS Duplexer", ieee transactions on ultrasonics, ferroelectrics, and frequency control, vol. 54, No. 9, Sep. 2007. 6 pages.

* cited by examiner

SURFACE ACOUSTIC WAVE RESONATOR, FILTER, MANUFACTURING METHOD THEREOF, AND COMMUNICATION DEVICE

TECHNICAL FIELD

Embodiments of the present disclosure relate to a surface acoustic wave resonator, a filter, a manufacturing method thereof and a communication device.

BACKGROUND

With the development of communication technology from 2G to 5G or even 6G, the number of communication bands is gradually increasing (for example, from 4 bands of 2G to more than 50 bands of 5G). Therefore, in order to improve the compatibility of different communication standards, the amount of filters required by communication devices such as smart phones will increase significantly, which will promote the large-scale growth of the filter market.

At present, in the communication devices such as smart phones, the widely used radio frequency filter is surface acoustic wave filter, which can be used to take out signals with specific frequencies from various input radio frequency signals. On the other hand, with the continuous development of communication technology and modular development of radio frequency (RF) front-end, the market demand for filters tends to be complicated, high-end and miniaturized.

SUMMARY

Embodiments of the present disclosure provide a surface acoustic wave resonator, a filter, a manufacturing method thereof, and a communication device. By arranging a dielectric layer between an interdigital transducer and a piezoelectric material layer, the surface acoustic wave resonator can reduce the electromechanical coupling coefficient of the surface acoustic wave resonator. In addition, the surface acoustic wave resonator can adjust the electromechanical coupling coefficient of the surface acoustic wave resonator by controlling the thickness of the dielectric layer. At least one resonator in the filter adopts the surface acoustic wave resonator with adjustable electromechanical coupling coefficient, so that higher performance, such as better passband or roll-off characteristics, can be achieved. On the other hand, the filter provided by the embodiments of the present disclosure can also remove the dielectric layer between the piezoelectric material layer and the interdigital transducer in other resonators by an etching process, so as to improve the steepness of transition band of the filter.

At least one embodiment of the disclosure provides a surface acoustic wave resonator, comprising: a piezoelectric material layer; an interdigital transducer located at a side of the piezoelectric material layer; and a dielectric layer, wherein the dielectric layer is located between the interdigital transducer and the piezoelectric material layer.

For example, in the surface acoustic wave resonator according to an embodiment of the disclosure, a material of the dielectric layer comprises one or more selected from the group consisting of silicon oxide, silicon nitride, and silicon oxynitride.

For example, in the surface acoustic wave resonator according to an embodiment of the disclosure, a thickness of the dielectric layer ranges from 5 nm to 20 nm.

For example, in the surface acoustic wave resonator according to an embodiment of the disclosure, the interdigital transducer comprises: a first electrode, comprising a plurality of first strip-shaped electrode portions; and a second electrode, comprising a plurality of second strip-shaped electrode portions, wherein each of the first strip-shaped electrode portions extends along a first direction, each of the second strip-shaped electrode portions extends along the first direction, and the plurality of first strip-shaped electrode portions and the plurality of second strip-shaped electrode portions are arranged in a second direction, and the second direction intersects with the first direction.

For example, in the surface acoustic wave resonator according to an embodiment of the disclosure, the plurality of first strip-shaped electrode portions and the plurality of second strip-shaped electrode portions are alternately arranged in the second direction.

For example, in the surface acoustic wave resonator according to an embodiment of the disclosure, at least two second strip-shaped electrode portions are arranged between two adjacent ones of the plurality of first strip-shaped electrode portions.

For example, the surface acoustic wave resonator according to an embodiment of the disclosure further comprises: an adjusting capacitor, comprising a first plate and a second plate, wherein the first plate is electrically connected with the first electrode, and the second plate is electrically connected with the second electrode.

For example, in the surface acoustic wave resonator according to an embodiment of the disclosure, the piezoelectric material layer comprises piezoelectric crystal or piezoelectric ceramic.

For example, in the surface acoustic wave resonator according to an embodiment of the disclosure, a material of the interdigital transducer comprises one or more selected from the group consisting of gold, tungsten, silver, titanium, platinum, aluminum, copper and molybdenum.

For example, the surface acoustic wave resonator according to an embodiment of the disclosure further comprises: a reflective electrode structure, located at a side of the piezoelectric material layer where the interdigital transducer is arranged, wherein the piezoelectric material layer comprises a first region and two second regions arranged in the second direction, the first region is located between the two second regions, the interdigital transducer is located in the first region, and the reflective electrode structure is located in the second regions.

For example, in the surface acoustic wave resonator according to an embodiment of the disclosure, the dielectric layer is located only in the first region.

At least one embodiment of the disclosure provides a filter comprising a series branch, comprising M series resonators; and N parallel branches, each of the parallel branches comprising at least one parallel resonator, wherein the M series resonators in the series branch are arranged in series, a first end of each of the parallel branches is grounded, a second end of each of the parallel branches is connected with the series branch, M and N are positive integers greater than or equal to 2, at least one of the M series resonators and parallel resonators in the N parallel branches adopts the surface acoustic wave resonator according to any items as mentioned above.

For example, in the filter according to an embodiment of the disclosure, the parallel resonators in the n parallel branches all adopt the surface acoustic wave resonators.

For example, in the filter according to an embodiment of the disclosure, at least some of the M series resonators adopt the surface acoustic wave resonators.

For example, in the filter according to an embodiment of the disclosure, a part of the M series resonators adopts the surface acoustic wave resonator, and another part of the M series resonators adopts a thin film resonator, the thin film resonator comprises: a piezoelectric layer; and an electrode pattern located at a side of the piezoelectric layer and in direct contact with the piezoelectric layer.

For example, in the filter according to an embodiment of the disclosure, according to a series order of the M series resonators, a first one of the M series resonators and a m-th one of the M series resonators adopt the surface acoustic wave resonator, and the other ones of the M series resonators adopt the thin film resonator.

At least one embodiment of the disclosure provides a communication device, comprising the filter according to any items as mentioned above.

At least one embodiment of the disclosure provides a manufacturing method of a filter, comprising: forming a dielectric material layer on a piezoelectric material layer; partially removing the dielectric material layer by using an etching process to form a dielectric layer and an opening region; and forming an interdigital transducer and an electrode pattern at a side of the piezoelectric material layer and the dielectric layer, wherein the interdigital transducer is located at a side of the dielectric layer away from the piezoelectric material layer, and the electrode pattern is located in the opening region and in direct contact with the piezoelectric material layer.

For example, in the manufacturing method of the filter according to an embodiment of the disclosure, the filter comprises a series branch comprising M series resonators; and N parallel branches, each of the N parallel branches comprises at least one parallel resonator, the M series resonators in the series branch are arranged in series, a first end of each of the N parallel branches is grounded, a second end of each of the N parallel branches is connected with the series branch, and both M and N are positive integers greater than or equal to 2, forming the interdigital transducer and the electrode pattern at the side of the piezoelectric material layer and the dielectric layer comprises: forming the interdigital transducer at the side of the dielectric layer to form parallel resonators in the N parallel branches and a part of the M series resonators; and forming the electrode pattern in the opening region of the dielectric layer to form another part of the M series resonators.

BRIEF DESCRIPTION OF THE DRAWINGS

In order to more clearly illustrate the technical solution of the embodiments of the present disclosure, the drawings of the embodiments will be briefly described in the following. It is obvious that the described drawings below are only related to some embodiments of the present disclosure without constituting any limitation thereto.

DETAILED DESCRIPTION

In order to make objectives, technical details and advantages of the embodiments of the present disclosure more clearly, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

Unless otherwise defined, the features such as "parallel", "vertical" and "identical" used in the embodiments of the present disclosure all include strictly "parallel", "vertical" and "identical" cases, and cases such as "substantially parallel", "substantially vertical" and "substantially identical" cases with certain errors. For example, the above-mentioned "substantially" may mean that the difference of the compared objects is within 10% or 5% of the average value of the compared objects. In the case where the number of a component or element is not specifically indicated in the following of the embodiments of the present disclosure, it refers to that the component or element can be one or more, or can be understood as at least one. "At least one" refers to one or more, and "a plurality" refers to at least two. The "disposed in the same layer" in the disclosed embodiment refers to the relationship among multiple film layers formed by the same material after the same step (for example, one-step patterning process). Herein, "the same layer" does not always refer to that the thickness of multiple film layers is the same or the height of multiple film layers in the cross-sectional view is the same.

In the research, the inventor(s) of the present application noticed that: with more and more frequency bands that the RF front-end module needs to support, the interval between adjacent filters is getting smaller and smaller; in the case where the frequency-temperature coefficient and quality factor of the filter cannot be controlled, it is very important for the filter to adjust the steepness of the filter transition band.

At least one embodiment of that present disclosure provides a surface acoustic wave resonator. The surface acoustic wave resonator includes a piezoelectric material layer, an interdigital transducer and a dielectric layer; the interdigital transducer is located at a side of the piezoelectric material layer, and the dielectric layer is located between the interdigital transducer and the piezoelectric material layer. Therefore, the surface acoustic wave resonator can reduce the electromechanical coupling coefficient of the surface acoustic wave resonator by arranging the dielectric layer between the interdigital transducer and the piezoelectric material layer. In addition, the surface acoustic wave resonator can adjust the electromechanical coupling coefficient of the surface acoustic wave resonator by controlling the thickness of the dielectric layer.

At least one embodiment of that present disclosure also provides a filter. The filter includes a series branch and N parallel branches; the series branch includes M series resonators, and each of the parallel branches includes at least one parallel resonator; the M series resonators in the series branch are arranged in series, a first end of each of the parallel branches is grounded, a second end of each of the parallel branches is connected between two adjacent ones of the series resonators, M and N are positive integers greater than or equal to 2, and at least one of the M series resonators and parallel resonators in the N parallel branches adopts any one of the abovementioned surface acoustic wave resonators, that is, the surface acoustic wave resonator with a dielectric layer between the piezoelectric material layer and the interdigital transducer. Usually, the electromechanical coupling coefficients of different resonators in the filter are similar, but at least one resonator in the filter provided by the embodiments of the present disclosure adopts the surface acoustic wave resonator with adjustable electromechanical coupling coefficient, so that higher performance, such as better passband or roll-off characteristics, can be achieved. On the other hand, the filter provided by the embodiments of the present disclosure can also remove the dielectric layer between the piezoelectric material layer and the interdigital transducer in other resonators by an etching process to improve the steepness of the transition band of the filter.

At least one embodiment of the present disclosure also provides a manufacturing method of a filter, the manufacturing method of a filter includes: forming a dielectric material layer on the piezoelectric material layer; partially removing the dielectric material layer by an etching process to form a dielectric layer and an opening region; and forming an interdigital transducer and an electrode pattern at a side of the piezoelectric material layer and the dielectric layer, the interdigital transducer is located at a side of the dielectric layer away from the piezoelectric material layer, and the electrode pattern is located in the opening region and in direct contact with the piezoelectric material layer. The interdigital transducer formed on the dielectric layer and the corresponding piezoelectric material layer can form the above-mentioned surface acoustic wave resonator, while the electrode pattern formed in the opening region and the corresponding piezoelectric material layer can form another resonator with different electromechanical coupling coefficient (hereinafter referred to as thin film resonator for differentiation). Therefore, in the manufacturing method of the filter, the dielectric material layer can be partially removed by the etching process to form the dielectric layer and the opening region, so that different resonators in the filter have different electromechanical coupling coefficients, thereby achieving higher performance, such as better passband or roll-off characteristics. In addition, the manufacturing method of the filter also has the advantages of simple process and low cost.

At least one embodiment of the present disclosure also provides a communication device. The communication device includes the above-mentioned filter, so the communication device also has higher performance and lower cost.

Hereinafter, the surface acoustic wave resonator, the filter, the manufacturing method, and the communication device provided by the embodiments of the present disclosure will be described in detail with reference to the accompanying drawings.

Figure 1:
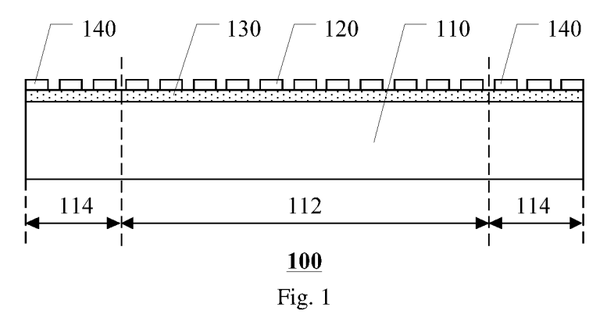
FIG. 1 is a schematic sectional view of a surface acoustic wave resonator provided by an embodiment of the present disclosure.

An embodiment of the present disclosure provides a surface acoustic wave resonator. FIG. 1 is a schematic sectional view of a surface acoustic wave resonator according to an embodiment of the present disclosure. As illustrated by FIG. 1, the surface acoustic wave resonator 100 includes a piezoelectric material layer 110, an interdigital transducer 120, and a dielectric layer 130. The interdigital transducer 120 is located at a side of the piezoelectric material layer 110, and drives the piezoelectric material layer 110 to generate surface acoustic waves by utilizing the inverse piezoelectric effect, or receives an electrical signal generated by the piezoelectric material layer 110 due to the piezoelectric effect; the dielectric layer 130 is located between the interdigital transducer 120 and the piezoelectric material layer 110.

In the surface acoustic wave resonator provided by the embodiments of the present disclosure, the electromechanical coupling coefficient of the surface acoustic wave resonator can be reduced by arranging a dielectric layer between the interdigital transducer and the piezoelectric material layer. In addition, the surface acoustic wave resonator can adjust the electromechanical coupling coefficient of the surface acoustic wave resonator by controlling the thickness of the dielectric layer. On the other hand, the surface acoustic wave resonator has the advantages of simple process and low cost by adding dielectric layers to adjust the dielectric coupling coefficient.

For example, each nanometer of the thickness of dielectric layer can correspond to the decrease of about 1% the electromechanical coupling coefficient.

In some examples, the material of the dielectric layer 130 may include one or more selected from the group consisting of silicon oxide, silicon nitride and silicon oxynitride. Of course, embodiments of the present disclosure include, but are not limited thereto. Other dielectric materials can also be used for the above-mentioned dielectric layer.

In some examples, the thickness of the dielectric layer 130 may range from 5 nm to 20 nm. Therefore, the surface acoustic wave resonator can have better performance. It should be noted that the thickness range of the dielectric layer mentioned above is the trade-off result after comprehensive consideration of the filter performance. If the thickness of the dielectric layer is less than 5 nm, the film quality of the dielectric layer is poor; if the thickness of the dielectric layer is greater than 25 nm, the quality factor of the surface acoustic wave resonator will decrease and the insertion loss of the filter using the surface acoustic wave resonator will increase.

Of course, embodiments of the present disclosure include, but are not limited thereto, and the thickness of the above-mentioned dielectric layer can also have other values.

In some examples, the piezoelectric material layer 110 includes piezoelectric crystal or piezoelectric ceramic. Of course, the embodiments of the present disclosure include but are not limited thereto, and the piezoelectric material layer can also be other types of piezoelectric materials.

In some examples, the material of the piezoelectric material layer 110 may be one or more selected from the group consisting of aluminum nitride (AlN), doped aluminum nitride (doped ALN), zinc oxide (ZnO), lead zirconate titanate (PZT), lithium niobate ($LiNbO_3$), quartz, potassium niobate ($KNbO_3$) and lithium tantalate ($LiTaO_3$). Of course, the embodiments of the present disclosure include, but are not limited thereto, the piezoelectric material layer can also be a composite structure of piezoelectric films, such as a composite structure of a lithium tantalate piezoelectric film/silicon dioxide/silicon substrate composite structure.

In some examples, the material of the interdigital transducer 120 may include one or more selected from the group consisting of gold, tungsten, silver, titanium, platinum, aluminum, copper and molybdenum. Of course, the embodiments of the present disclosure include but are not limited thereto, and the material of the interdigital transducer can also be other conductive materials.

Figure 2:
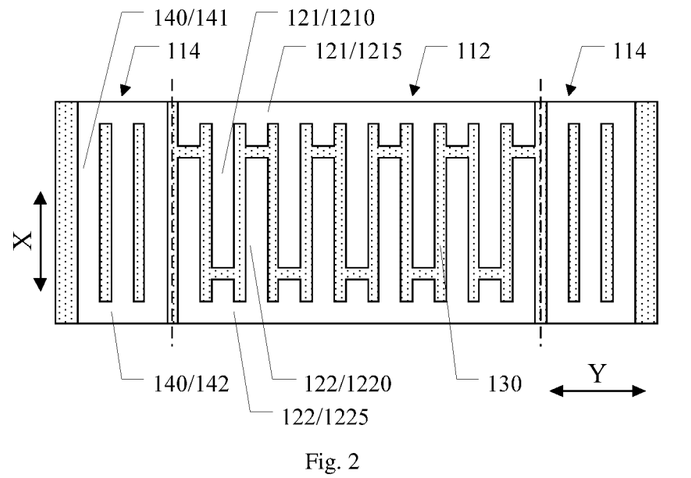
FIG. 2 is a schematic plan view of a surface acoustic wave resonator according to an embodiment of the present disclosure.

FIG. 2 is a schematic plan view of a surface acoustic wave resonator according to an embodiment of the present disclosure. As illustrated by FIG. 2, the interdigital transducer 120 includes a first electrode 121 and a second electrode 122; the first electrode 121 includes a plurality of first strip-shaped electrode portions 1210, and the second electrode 122 includes a plurality of second strip-shaped electrode portions 1220. Each first strip-shaped electrode portion 1210 extends along the first direction X, each second strip-shaped electrode portion 1220 extends along the first direction X, a plurality of first strip-shaped electrode portions 1210 and a plurality of second strip-shaped electrode portions 1220 are arranged in the second direction Y, and the second direction intersects with the first direction. It should be noted that, in FIG. 2, the number of the strip-shaped electrode portions is only schematic, and the embodiments of the present disclosure is not specifically limited herein.

For example, the second direction may be perpendicular to the first direction. Of course, embodiments of the present disclosure include but are not limited thereto, and the second direction and the first direction may not be perpendicular.

In some examples, as illustrated by FIG. 2, a plurality of first strip-shaped electrode portions 1210 and a plurality of second strip-shaped electrode portions 1220 are alternately arranged in the second direction. That is, only one second strip-shaped electrode portion 1220 is arranged between two adjacent first strip-shaped electrode portions 1210, and only one first strip-shaped electrode portion 1210 is arranged between two adjacent second strip-shaped electrode portions 1220. In this way, the surface acoustic wave resonator has higher electromechanical coupling coefficient.

In some examples, as illustrated by FIG. 2, the first electrode 121 further includes a first bus bar 1215 connected to the ends of the plurality of first strip-shaped electrode portions 1210, thereby forming a comb-like structure; the second electrode 122 further includes a second bus bar 1225 connected to the ends of the plurality of second strip-shaped electrode portions 1220, thereby forming a comb-like structure.

In some examples, as illustrated by FIG. 2, the surface acoustic wave resonator 100 further includes a reflective electrode structure 140, which is located at the side of the piezoelectric material layer 110 where the interdigital transducer 120 is arranged. The piezoelectric material layer 110 includes a first region 112 and two second regions 114 arranged in the second direction Y. The first region 112 is located between the two second regions 114, the interdigital transducer 120 is located in the first region 112, and the reflective electrode structure 140 is located in the second region 114. That is, the reflective electrode structures 140 are located on both sides of the interdigital transducer 120 in the second direction Y. The reflective electrode structure 140 can be used to reflect the surface acoustic wave generated by the interdigital transducer 120.

In some examples, as illustrated by FIG. 2, the reflective electrode structure 140 may include a plurality of third strip-shaped electrode portions 141 arranged in the second direction Y and a third bus bar 142 connecting the plurality of third strip-shaped electrode portions 141, thereby forming an electrode structure having a grid shape.

Figure 3:
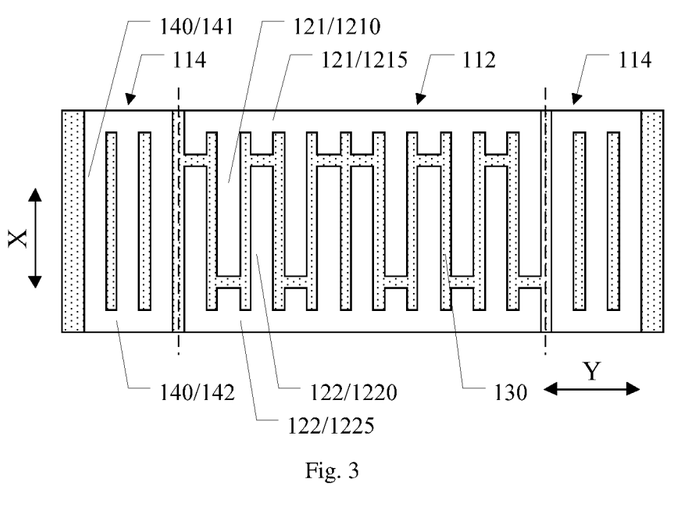
FIG. 3 is a schematic plan view of another surface acoustic wave resonator provided by an embodiment of the present disclosure.

FIG. 3 is a schematic plan view of another surface acoustic wave resonator provided by an embodiment of the present disclosure. As illustrated by FIG. 3, the interdigital transducer 120 includes a first electrode 121 and a second electrode 122; the first electrode 121 includes a plurality of first strip-shaped electrode portions 1210, and the second electrode 122 includes a plurality of second strip-shaped electrode portions 1220. Each first strip-shaped electrode portion 1210 extends along the first direction X, each second strip-shaped electrode portion 1220 extends along the first direction X, a plurality of first strip-shaped electrode portions 1210 and a plurality of second strip-shaped electrode portions 1220 are arranged in the second direction Y, and at least two second strip-shaped electrode portions 1220 are arranged between two adjacent first strip-shaped electrode portions 1210, so that the alternating arrangement of the first strip-shaped electrode portions and the second strip-shaped electrode portions can be changed to reduce the electromechanical coupling coefficient. Therefore, the surface acoustic wave resonator adjusts the electromechanical coupling coefficient by arranging at least two second strip-shaped electrode portions between two adjacent first strip-shaped electrode portions.

Figure 4:
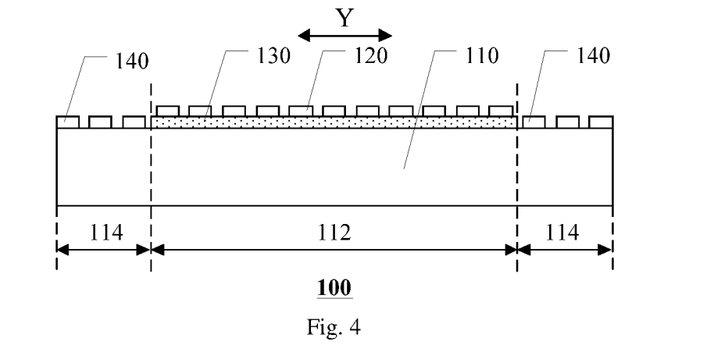
FIG. 4 is a schematic sectional view of another surface acoustic wave resonator provided by an embodiment of the present disclosure.

FIG. 4 is a schematic sectional view of another surface acoustic wave resonator provided by an embodiment of the present disclosure. As illustrated by FIG. 4, the piezoelectric material layer 110 includes a first region 112 and two second regions 114 arranged in the second direction Y. The first region 112 is located between the two second regions 114, the interdigital transducer 120 is located in the first region 112, and the reflective electrode structure 140 is located in the second region 114. In this case, the dielectric layer 130 is only located in the first region 112, that is, the dielectric layer 130 is only arranged between the interdigital transducer 120 and the piezoelectric material layer 110, and not between the reflective electrode structure 140 and the piezoelectric material layer 110.

Of course, the embodiments of the present disclosure include but are not limited thereto. Referring to FIG. 1, the dielectric layer 130 can also be arranged between the reflective electrode structure 140 and the piezoelectric material layer 100, so that the patterning process of the dielectric layer can be saved.

Figure 5:
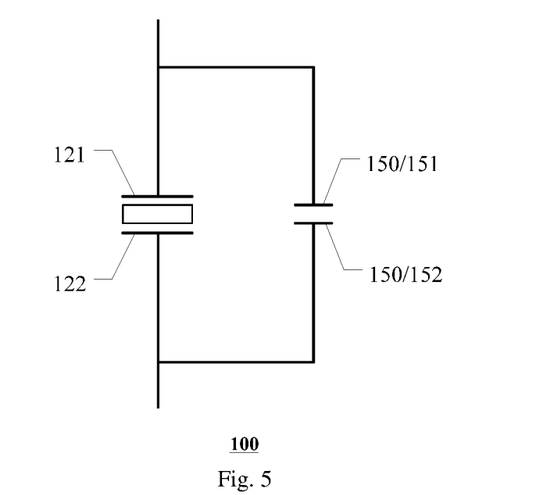
FIG. 5 is a schematic diagram of another surface acoustic wave resonator provided by an embodiment of the present disclosure.

FIG. 5 is a schematic diagram of another surface acoustic wave resonator provided by an embodiment of the present disclosure. As illustrated by FIG. 5, the surface acoustic wave resonator 100 may further include an adjusting capacitor 150, which includes a first plate 151 and a second plate 152. The first plate 151 is electrically connected with the first electrode 121, and the second plate 152 is electrically connected with the second electrode 122. Therefore, the surface acoustic wave resonator can adjust the electromechanical coupling coefficient by connecting an adjusting capacitor in parallel.

It should be noted that the surface acoustic wave resonator shown in FIG. 5 may also include a dielectric layer as illustrated by FIG. 1, and the interdigital transducer as illustrated by FIG. 3 may also be used. That is, the above-mentioned ways of adjusting the electromechanical coupling coefficient of surface acoustic wave resonators can be combined with each other.

Figure 6A:
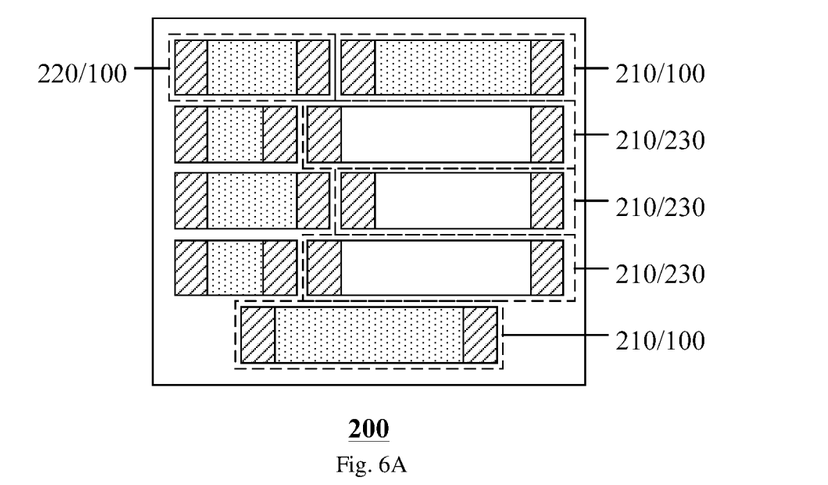
FIG. 6A is a schematic plan view of a filter provided by an embodiment of the disclosure.
Figure 6B:
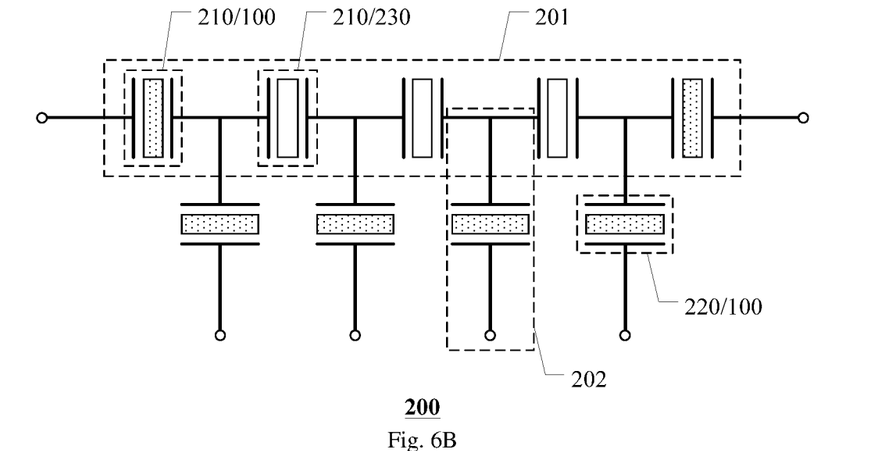
FIG. 6B is an equivalent circuit diagram of a filter provided by an embodiment of the disclosure.

An embodiment of the present disclosure also provides a filter. FIG. 6A is a schematic plan view of a filter provided by an embodiment of the disclosure; FIG. 6B is an equivalent circuit diagram of a filter provided by an embodiment of the disclosure. As illustrated by FIGS. 6A and 6B, the filter 200 includes a series branch 201 and N parallel branches 202. The series branch 201 includes M series resonators 210, and each of the parallel branches 202 includes at least one parallel resonator 220. The M series resonators 210 in the series branch 201 are arranged in series, a first end of each of the parallel branches 202 is grounded, and a second end of each of the parallel branches 202 is connected to the series branch 201, and both M and N are positive integers greater than or equal to 2; at least one of the M series resonators 210 and the parallel resonators 220 in the N parallel branches 202 adopts any one of the above surface acoustic wave resonators 100. That is, at least one resonator in the filter adopts any one of the abovementioned surface acoustic wave resonator 100.

Usually, the electromechanical coupling coefficients of different resonators in the filter are the same, so the performance and parameter changes of the filter including multiple resonators are limited to a certain extent, and it is difficult to meet the current market demand. However, in the filter provided by the embodiments of the present disclosure, because the above-mentioned surface acoustic wave resonator can adjust the electromechanical coupling coefficient of the surface acoustic wave resonator by arranging a dielectric layer between the interdigital transducer and the piezoelectric material layer. The filter can realize higher performance, such as better passband or roll-off characteristics, by adopting the above-mentioned surface acoustic wave resonator with adjustable electromechanical coupling coefficient for at least one resonator. On the other hand, the filter provided by the embodiments of the present disclosure can also remove the dielectric layer between the piezoelectric material layer and the interdigital transducer in other resonators by an etching process to improve the steepness of the transition band of the filter.

In some examples, as illustrated by FIGS. 6A and 6B, the parallel resonators 220 in the N parallel branches 202 all adopt the surface acoustic wave resonator 100, thus having better performance.

In some examples, as illustrated by FIGS. 6A and 6B, at least some of the M series resonators 210 adopt the above-mentioned surface acoustic wave resonators 100, so that the steepness of the filter transition band can be improved.

In some examples, as illustrated by FIGS. 6A and 6B, a part of the M series resonators 210 adopts the surface acoustic wave resonator 100, and another part of the M series resonators 210 adopts a thin film resonator 230.

Figure 7:
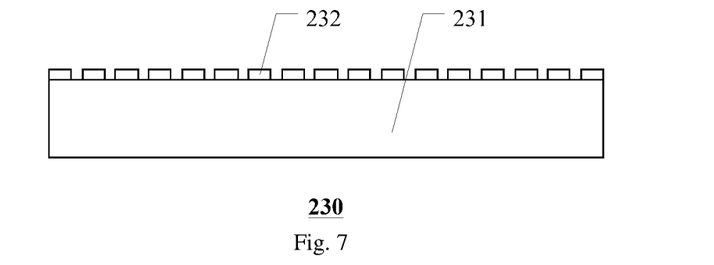
FIG. 7 is a schematic sectional view of a thin film resonator provided by an embodiment of the present disclosure.

FIG. 7 is a schematic sectional view of a thin film resonator according to an embodiment of the present disclosure. As illustrated by FIG. 7, the thin-film resonator 230 includes a piezoelectric layer 231 and an electrode pattern 232. The electrode pattern 232 is located at a side of the piezoelectric layer 231 and is in direct contact with the piezoelectric layer 231. That is, the thin film resonator 230 is not provided with a dielectric layer between the piezoelectric layer and the electrode pattern.

In some examples, as illustrated by FIGS. 6A and 6B, the piezoelectric material layer 110 of the surface acoustic wave resonator 100 and the piezoelectric layer 231 of the thin film resonator 230 may be the same layer. Furthermore, the interdigital transducer 120 of the surface acoustic wave resonator 100 and the electrode pattern 232 of the thin film resonator 230 are arranged in the same layer.

In some examples, as illustrated by FIGS. 6A and 6B, according to the series order of M series resonators, the first one and the m-th one of the M series resonators 210 arranged in series adopt the surface acoustic wave resonator 100, and the other ones of the M series resonators 210 adopt the above-mentioned thin film resonators 230.

Figure 8:
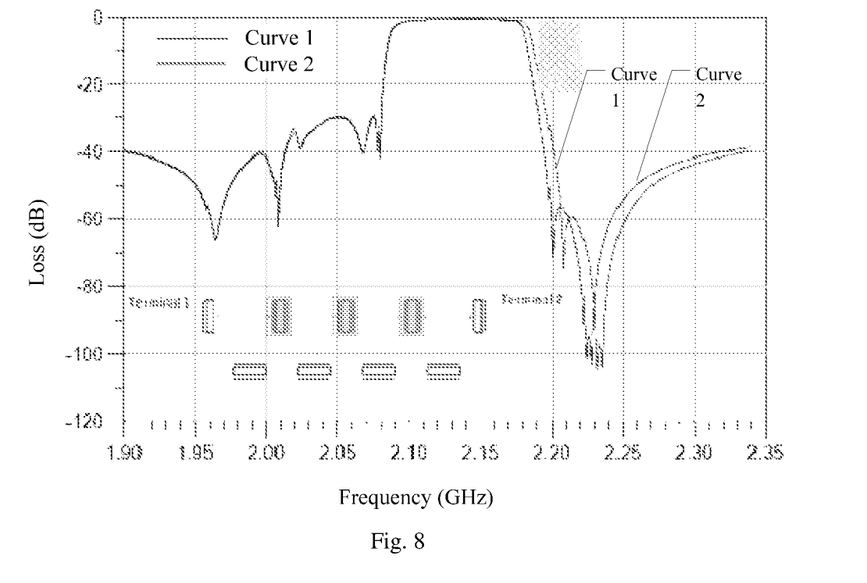
FIG. 8 is a transmission characteristic curve of a filter provided by an embodiment of the disclosure.

FIG. 8 is a transmission characteristic curve of a filter provided by an embodiment of the disclosure. As illustrated by FIG. 8, curve 1 shows the filter whose resonators are all surface acoustic wave resonators, and curve 2 shows the filter shown in FIGS. 6A and 6B. It can be seen that the filter can improve the steepness of the transition band of the filter by adopting the above-mentioned thin film resonator in the series resonators between the first one and the m-th one of the M series resonators, that is, the dielectric layers of the series resonators in the M series resonators except the first one and the m-th one of the M series resonators are removed.

Figure 9:
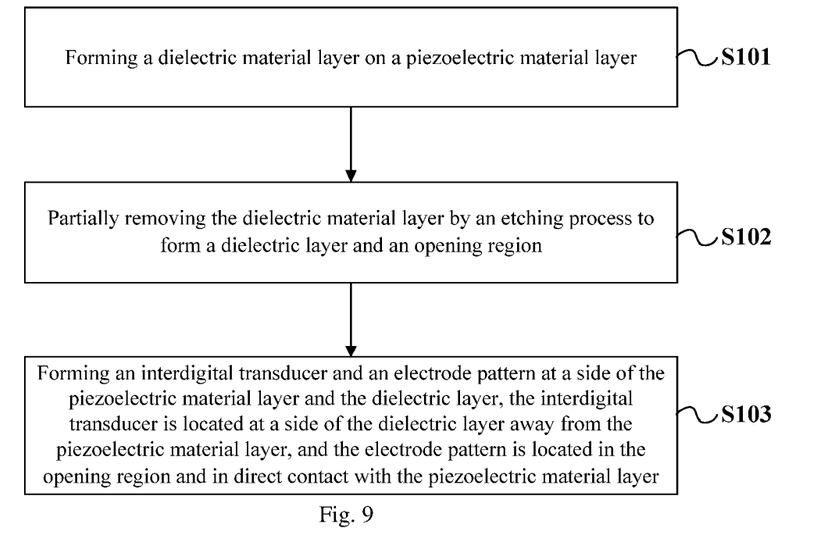
FIG. 9 is a schematic diagram of a manufacturing method of a filter provided by an embodiment of the disclosure.

An embodiment of the disclosure also provides a manufacturing method of the filter. FIG. 9 is a schematic diagram of a manufacturing method of a filter provided by an embodiment of the disclosure. As illustrated by FIG. 9, the manufacturing method of the filter includes the following steps S101-S103.

S101: forming a dielectric material layer on a piezoelectric material layer;

S102: partially removing the dielectric material layer by an etching process to form a dielectric layer and an opening region; and S103: forming an interdigital transducer and an electrode pattern at a side of the piezoelectric material layer and the dielectric layer, the interdigital transducer is located at a side of the dielectric layer away from the piezoelectric material layer, and the electrode pattern is located in the opening region and in direct contact with the piezoelectric material layer.

In the manufacturing method of the filter provided by the disclosed embodiment, the interdigital transducer formed on the dielectric layer and the corresponding piezoelectric material layer can form the above-mentioned surface acoustic wave resonator, while the electrode pattern formed in the opening region and the corresponding piezoelectric material layer can form the above-mentioned thin film resonator. Therefore, in the manufacturing method of the filter, the dielectric material layer can be partially removed by the etching process to form the dielectric layer and the opening region, so that different resonators in the filter have different electromechanical coupling coefficients, thereby achieving higher performance, such as better passband or roll-off characteristics. In addition, the manufacturing method of the filter also has the advantages of simple process and low cost.

In some examples, the filter may include a series branch including M series resonators; and N parallel branches, each of the parallel branches includes at least one parallel resonator, the M series resonators in the series branch are arranged in series, a first end of each of the parallel branches is grounded, a second end of each of parallel branches is connected with the series branch, and both M and N are positive integers greater than or equal to 2. In this case, forming the interdigital transducer and electrode pattern at the side of the piezoelectric material layer and the dielectric layer includes: forming the interdigital transducer at the side of the dielectric layer to form parallel resonators in the N parallel branches and a part of M series resonators; and forming an electrode pattern in the opening region of the dielectric layer to form another part of the M series resonators. It should be noted that the specific structure of this filter can be seen in the related descriptions of FIGS. 6A and 6B.

Figure 10:
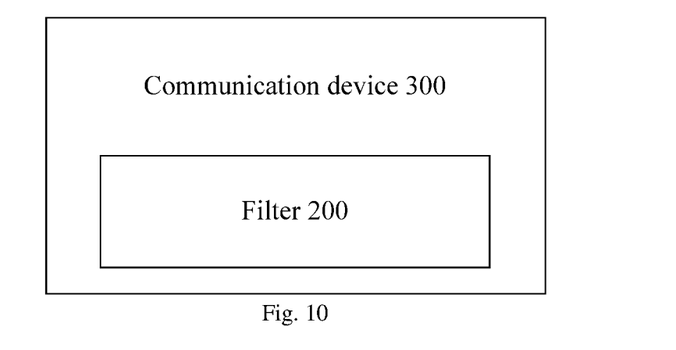
FIG. 10 is a schematic diagram of a communication device provided by an embodiment of the disclosure.

At least one embodiment of the present disclosure also provides a communication device. FIG. 10 is a schematic diagram of a communication device provided by an embodiment of the disclosure. As illustrated by FIG. 10, the communication device 300 includes the abovementioned filter 200. Because the communication device includes the above filter, the communication device also has higher performance and lower cost.

In some examples, the above-mentioned communication device includes but is limited to intermediate products such as RF front end, filtering and amplifying module, and also includes terminal products such as smart phones, WIFI, unmanned aerial vehicles, etc.

It is to be noted that:

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure can be combined.

What have been described above are only specific implementations of the present disclosure, the protection scope of the present disclosure is not limited thereto, and easily conceivable changes or substitutions should be covered within the protection scope of the present disclosure. Therefore, the protection scope of the present disclosure should be based on the protection scope of the claims.

The invention claimed is:

1. A surface acoustic wave resonator, comprising:
   a piezoelectric material layer;
   an interdigital transducer located at a side of the piezoelectric material layer; and
   a dielectric layer,
   wherein the dielectric layer is located between the interdigital transducer and the piezoelectric material layer, and
   a thickness of the dielectric layer ranges from 5 nm to 20 nm.

2. The surface acoustic wave resonator according to claim 1, wherein a material of the dielectric layer comprises one or more selected from the group consisting of silicon oxide, silicon nitride, and silicon oxynitride.

3. The surface acoustic wave resonator according to claim 1, wherein the piezoelectric material layer comprises piezoelectric crystal or piezoelectric ceramic.

4. The surface acoustic wave resonator according to claim 1, wherein the interdigital transducer comprises:
   a first electrode, comprising a plurality of first strip-shaped electrode portions; and
   a second electrode, comprising a plurality of second strip-shaped electrode portions,
   wherein each of the plurality of first strip-shaped electrode portions extends along a first direction, each of the plurality of second strip-shaped electrode portions extends along the first direction, and the plurality of first strip-shaped electrode portions and the plurality of second strip-shaped electrode portions are arranged in a second direction, and the second direction intersects with the first direction.

5. The surface acoustic wave resonator according to claim 4, wherein the plurality of first strip-shaped electrode portions and the plurality of second strip-shaped electrode portions are alternately arranged in the second direction.

6. The surface acoustic wave resonator according to claim 4, wherein at least two second strip-shaped electrode portions are arranged between two adjacent ones of the plurality of first strip-shaped electrode portions.

7. The surface acoustic wave resonator according to claim 4, further comprising:
   an adjusting capacitor, comprising a first plate and a second plate,
   wherein the first plate is electrically connected with the first electrode, and the second plate is electrically connected with the second electrode.

8. The surface acoustic wave resonator according to claim 4, further comprising:
   a reflective electrode structure, located at a side of the piezoelectric material layer where the interdigital transducer is arranged,
   wherein the piezoelectric material layer comprises a first region and two second regions arranged in the second direction, the first region is located between the two second regions, the interdigital transducer is located in the first region, and the reflective electrode structure is located in the second regions.

9. The surface acoustic wave resonator according to claim 1, wherein a material of the interdigital transducer comprises one or more selected from the group consisting of gold, tungsten, silver, titanium, platinum, aluminum, copper and molybdenum.

10. A manufacturing method of a filter, comprising:
    forming a dielectric material layer on a piezoelectric material layer;
    partially removing the dielectric material layer by using an etching process to form a dielectric layer and an opening region; and
    forming an interdigital transducer and an electrode pattern at a side of the piezoelectric material layer and the dielectric layer,
    wherein the interdigital transducer is located at a side of the dielectric layer away from the piezoelectric material layer, and the electrode pattern is located in the opening region and in direct contact with the piezoelectric material layer, and
    a thickness of the dielectric layer ranges from 5 nm to 20 nm.

11. The manufacturing method of the filter according to claim 10, wherein the filter comprises a series branch comprising M series resonators; and N parallel branches, each of the N parallel branches comprises at least one parallel resonator, the M series resonators in the series branch are arranged in series, a first end of each of the N parallel branches is grounded, a second end of each of the N parallel branches is connected with the series branch, and both M and N are positive integers greater than or equal to 2,
    forming the interdigital transducer and the electrode pattern at the side of the piezoelectric material layer and the dielectric layer comprises:

forming the interdigital transducer at the side of the dielectric layer to form parallel resonators in the N parallel branches and a part of the M series resonators; and forming the electrode pattern in the opening region of the dielectric layer to form another part of the M series resonators.

12. A filter comprising:

a series branch, comprising M series resonators; and

N parallel branches, each of the parallel branches comprising at least one parallel resonator, wherein the M series resonators in the series branch are arranged in series, a first end of each of the parallel branches is grounded, a second end of each of the parallel branches is connected with the series branch, M and N are positive integers greater than or equal to 2, at least one of the M series resonators and parallel resonators in the N parallel branches adopts the surface acoustic wave resonator according to claim 1.

13. The filter according to claim 12, wherein the parallel resonators in the n parallel branches all adopt the surface acoustic wave resonators.

14. The filter according to claim 12, wherein at least some-two of the M series resonators adopt the surface acoustic wave resonators.

15. The filter according to claim 14, wherein a part of the M series resonators adopts the surface acoustic wave resonator, and another part of the M series resonators adopts a thin film resonator, the thin film resonator comprises:

a piezoelectric layer; and an electrode pattern located at a side of the piezoelectric layer and in direct contact with the piezoelectric layer.

16. The filter according to claim 15, wherein, according to a series order of the M series resonators, a first one of the M series resonators and a m-th one of the M series resonators adopt the surface acoustic wave resonator, and the other ones of the M series resonators adopt the thin film resonator.

17. A communication device, comprising the filter according to claim 12.

18. A surface acoustic wave resonator, comprising:

a piezoelectric material layer;

an interdigital transducer located at a side of the piezoelectric material layer; and a dielectric layer, a reflective electrode structure, located at a side of the piezoelectric material layer where the interdigital transducer is arranged, wherein the dielectric layer is located between the interdigital transducer and the piezoelectric material layer, the piezoelectric material layer comprises a first region and two second regions arranged in the second direction, the first region is located between the two second regions, the interdigital transducer is located in the first region, and the reflective electrode structure is located in the second regions, the dielectric layer is located only in the first region.

* * * * *